United States Patent
Shang et al.

(10) Patent No.: US 11,423,956 B2
(45) Date of Patent: Aug. 23, 2022

(54) SENSITIVITY AMPLIFIER, ITS CONTROL METHOD, MEMORY AND ITS READ-WRITE CIRCUIT

(71) Applicant: ChangXin Memory Technologies, Inc., Hefei (CN)

(72) Inventors: WeiBing Shang, Hefei (CN); KanYu Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/280,818

(22) PCT Filed: Nov. 27, 2019

(86) PCT No.: PCT/CN2019/121160
§ 371 (c)(1),
(2) Date: Mar. 26, 2021

(87) PCT Pub. No.: WO2021/051651
PCT Pub. Date: Mar. 25, 2021

(65) Prior Publication Data
US 2021/0407557 A1      Dec. 30, 2021

(30) Foreign Application Priority Data

Sep. 20, 2019  (CN) .......................... 201910892047.6

(51) Int. Cl.
*G11C 11/4091* (2006.01)
*G11C 7/06* (2006.01)
(Continued)

(52) U.S. Cl.
CPC ................ *G11C 7/065* (2013.01); *G11C 7/12* (2013.01); *G11C 7/22* (2013.01); *G11C 11/4091* (2013.01)

(58) Field of Classification Search
CPC ....................................................... G11C 7/065
See application file for complete search history.

(56) References Cited

U.S. PATENT DOCUMENTS

| | | | | |
|---|---|---|---|---|
| 2010/0165771 | A1* | 7/2010 | Kawasumi | G11C 7/22 365/207 |
| 2022/0028436 | A1* | 1/2022 | Lu | G11C 7/08 |
| 2022/0068357 | A1* | 3/2022 | Lin | G11C 5/06 |

FOREIGN PATENT DOCUMENTS

| | | |
|---|---|---|
| CN | 101149969 A | 3/2008 |
| CN | 106409328 A | 2/2017 |

(Continued)

OTHER PUBLICATIONS

WIPO Application No. PCT/CN2019/121160, PCT International Search Report dated Jun. 22, 2020.

(Continued)

*Primary Examiner* — Min Huang
(74) *Attorney, Agent, or Firm* — Alston & Bird LLP

(57) ABSTRACT

The present invention provides a sensitivity amplifier, its control method, a memory read-write circuit and a memory device. The sensitivity amplifier includes: a first PMOS transistor and a second PMOS transistor, a first NMOS transistor and a second NMOS transistor, a first input/output terminal, and a second input/output terminal; four switch unit, the first PMOS and the first NMOS transistors are respectively connected to the first input/output terminal through one switch unit, the second PMOS and the second NMOS transistors are respectively connected to the second input/output terminal through another switch unit. The switch units configure each PMOS transistor and each NMOS transistor in an amplifier mode or in a diode mode. The first NMOS transistor's gate connects to the bit line, and (Continued)

the second NMOS transistor's gate connects to the reference bit line. The disclosed sensitivity amplifier has improved performance.

20 Claims, 11 Drawing Sheets

(51) Int. Cl.
   *G11C 7/12* (2006.01)
   *G11C 7/22* (2006.01)

(56) References Cited

FOREIGN PATENT DOCUMENTS

| | | |
|---|---|---|
| CN | 208796671 U | 4/2019 |
| WO | WO 2021-051651 A1 | 3/2021 |

OTHER PUBLICATIONS

WIPO Application No. PCT/CN2019/121160, PCT Written Opinion of the International Searching Authority dated Jun. 22, 2020.

\* cited by examiner

SENSITIVITY AMPLIFIER, ITS CONTROL METHOD, MEMORY AND ITS READ-WRITE CIRCUIT

CROSS REFERENCES TO RELATED APPLICATIONS

This application is a national phase entry of International Application No. PCT/CN2019/121160 filed on Nov. 27, 2019, which claims the benefit of priority to CN Patent Application CN 201910892047.6 filed on Sep. 20, 2019, both entitled "Sensitivity Amplifier, Its Control Method, Memory and Its Read-Write Circuit", the contents of which are incorporated herein by reference in its entirety.

TECHNICAL FIELD

The invention relates to the field of circuits, in particular to a sensitivity amplifier and a control method, a memory device and a read-write circuit thereof.

BACKGROUND

Semiconductor storage devices, such as Static Random-Access Memory (SRAM), Dynamic Random Access Memory (DRAM), Read-Only Memory (ROM), Flash, etc., usually are arranged in a two-dimensional array composed of memory units. The memory cells of each row of the array can be selected by the word line (WL, Word Line), the memory cells of each column of the array can be selected by the bit line and the reference bit line. The sensitivity amplifier senses and amplifies the voltage difference between the bit line and the reference bit line, then writes information to the memory units or read the stored information from the memory units.

As shown in FIG. 1, a commonly used sensitivity amplifier includes a latch circuit. One side of the latch circuit includes transistor M1 and transistor M2, and the other side includes transistor M3 and transistor M4. M1 and M2 form an inverter INV1, and M3 and M4 form another inverter INV2. Their inputs and outputs are respectively connected to form a latch circuit. VH provides power for the latch circuit and VH is connected to the latch circuit by M5; GND is the ground wire of the sensitivity amplifier, and GND is connected to the latch circuit by M6.

The operation of the above-mentioned sensitivity amplifier is divided into three stages: EQ stage, small signal input stage and signal amplification stage. In the EQ stage, the EQ circuit pre-charges the sensitivity amplifier, and the bit line Vin+ and the reference bit line Vin− need to be pre-charged to half of the power supply voltage VH/2.

In the small signal input stage, the small signal can be input from the switch Sx or Sy in FIG. 1. When there is a mismatch between the amplifier's paired transistors, such as a threshold voltage deviation, this deviation causes the input signal to have a larger amplitude in order to get a correct output. For example, there are threshold voltage deviations, gate oxide thickness deviations, and channel doping concentration differences among corresponding transistors in the latch circuit. Therefore, there can be a mismatch voltage ΔVin+ between Vin+ and Vin−.

Therefore, how to eliminate the mismatch problem of the amplifier's paired transistors is a problem to be solved urgently.

SUMMARY

The technical problem to be solved by the present invention is to provide a sensitivity amplifier and its control method, and a memory device to improve the performance of the sensitivity amplifier.

To solve the above problems, the present invention provides a sensitivity amplifier, including: two PMOS transistors, two NMOS transistors, a first input/output terminals and a second input/output terminals, the two PMOS transistors are respectively the first PMOS transistor, a second PMOS transistor, the two NMOS transistors are respectively a first NMOS transistor and a second NMOS transistor; four switch units, the first PMOS transistor and the first NMOS transistor are respectively connected by a switch unit to the first input/output terminals, the second PMOS transistor and the second NMOS transistor are respectively connected to the second input/output terminals through a switch unit, and the switch units are used to configure each of the PMOS transistors and each of the NMOS transistors in amplification mode or diode mode. The gate of the first NMOS transistor connects to a bit line, and the gate of the second NMOS transistor connects to a reference bit line.

Optionally, the switch unit includes a first switch and a second switch. The first switch is connected between the gate and the drain of the PMOS transistor and the NMOS transistor, and the second switch is connected between gates of the PMOS transistor and the NMOS transistor and the corresponding input/output terminals.

Optionally, the drain of the first PMOS transistor connects to the drain of the first NMOS transistor and also connects to the second input/output terminals. The sources of first PMOS transistor and the second PMOS transistor are connected as the high voltage end. The drain of the second PMOS transistor connects to the drain of the second NMOS transistor, further connects to the first input/output terminals. The source of the first NMOS transistor and the source of the second NMOS transistor are connected as a low-voltage end.

Optionally, it further includes: a first driving unit and a second driving unit. The first driving unit includes a first pull-up transistor, a drain of the first pull-up transistor is connected to a high voltage terminal, and a source of the first pull-up transistor is connected to a power source. The second driving unit includes a first pull-down transistor, the drain of the first pull-down transistor is connected to the low voltage terminal, and the source of the first pull-down transistor is grounded.

Optionally, the first driving unit further includes a second pull-up transistor, the drain of the second pull-up transistor is connected to the high voltage terminal, and the source is connected to the power supply; the second driving unit further includes a second pull-up transistor. A pull-down transistor, the drain of the second pull-down transistor is connected to the low voltage terminal, and the source is grounded; the type of the second pull-up transistor is different from the type of the first pull-up transistor, and the type of the second pull-down transistor is The first pull-down transistor has a different type.

Optionally, a first pre-charging module is connected between the first input/output terminal and the second input/output terminal.

Optionally, a second pre-charging module is connected between the high-voltage terminal and the low-voltage terminal.

Optionally, the first switch and the second switch respectively include at least one of a MOS tube, a diode, or a thyristor.

The present invention also provides a memory read-write circuit, including: a sensitivity amplifier, the second driving unit further includes a feedback transistor, the source of the feedback transistor is grounded, and the drain is connected to the source of the first pull-down transistor; a negative feedback adjustment module, which includes a cloning circuit and an operational amplifier, the cloning circuit includes at least a set of inverters of one NMOS transistor and a PMOS transistor, and a circuit of the same structure having the first drive unit and the second drive unit. The NMOS transistor and the PMOS transistor are connected at the gates similarly as in a diode mode, and the gate connecting node connects to the positive input terminal of the operational amplifier. The output terminal of the operational amplifier connects to the gate of the feedback transistor of the second driving unit, and further connects to the gate of the clone transistor in the clone circuit corresponding to the feedback transistor.

Optionally, the negative input terminal of the operational amplifier is connected to the reference voltage terminal.

To solve the above-mentioned problems, the present invention also provides a memory device, which is characterized by comprising the sensitivity amplifier described above.

To solve the above-mentioned problems, the present invention also provides a control method of the above-mentioned sensitivity amplifier, which includes: a pre-charging stage, in this stage, the first input/output terminal and the second input/output terminal to are pre-charged to a preset voltage. In the pre-charging phase, the two PMOS transistors and the two NMOS transistors are both connected in a diode mode, and the gates of the first PMOS transistor and the first NMOS transistor are connected to the first input/output terminals, and the gates of the second PMOS transistor and the second NMOS transistor are connected to the second input/output terminals; after the pre-charge is completed, the mismatch elimination phase is entered, in this phase, the connections between the two PMOS transistors and the two NMOS transistors are adjusted to compensates for the mismatch voltage differences between the first input/output terminal and the second input/output terminal.

Optionally, the mismatch elimination stage includes a first mismatch elimination stage, and the first mismatch elimination stage includes: connecting the first PMOS transistor and the second PMOS transistor in a diode mode, and connecting the first NMOS transistor and the second NMOS transistor in an amplifier mode; or connecting the first NMOS transistor and the second NMOS transistor in a diode mode, and connecting the first PMOS transistor and the second PMOS transistor in an amplifier mode.

Optionally, the mismatch elimination stage includes a second mismatch elimination stage, which includes: connecting the first PMOS transistor, the second PMOS transistor, the first NMOS transistor, and the second NMOS transistors all in a diode mode.

Optionally, when the mismatch elimination stage includes both the first mismatch elimination stage and the second mismatch elimination stage, and the second mismatch elimination stage occurs after the first mismatch elimination stage.

Optionally, after the mismatch elimination stage is completed, there are the small signal input stage and the signal amplification stage.

Optionally, in the signal amplification stage, both the two PMOS transistors and the two NMOS transistors are connected in an amplifier mode.

Optionally, a first switch is connected between the gates and drains of the two PMOS transistors and the two NMOS transistors, and a second switch is connected between the gates of the two PMOS transistors and the two NMOS transistors and the corresponding input/output terminals. In the signal amplification stage, the first switch is turned off and the second switch is turned on.

Optionally, the mismatch elimination stage includes a first mismatch elimination stage. In the first mismatch elimination stage, the second switch connected to the gates of the two PMOS transistors is turned off, the first switch connected between the gates and drains of the two PMOS transistors is turned on, the second switch connected to the gates of the two NMOS transistors is turned on, and the first switch between the gates and the drains of the two NMOS transistors is turned turned off; or, the second switch connected to the gates of the two PMOS transistors is turned on, and the first switch connected to the gates and the drains of the two PMOS transistors is turned off, the second switch connected to the gates of the two NMOS transistors is turned off, and the first switch connected between the gates and the drains of the two NMOS transistors is turned on.

Optionally, the mismatch elimination stage includes a second mismatch elimination stage. In the second mismatch elimination stage, the first switches are all turned on and the second switches are all turned off.

According to the present invention, in the sensitivity amplifier and the control method thereof, a switch unit is connected to the two NMOS transistors and two PMOS transistors of the sensitivity amplifier. In adjusting how the NMOS transistors and the PMOS transistors are connected through the switch unit, in the time sequence control of the sensitivity amplifier circuit, a mismatch elimination stage can be added. By switching the connection modes of each MOS transistors, the mismatch voltage can be compensated, thereby eliminating the voltage mismatch.

It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
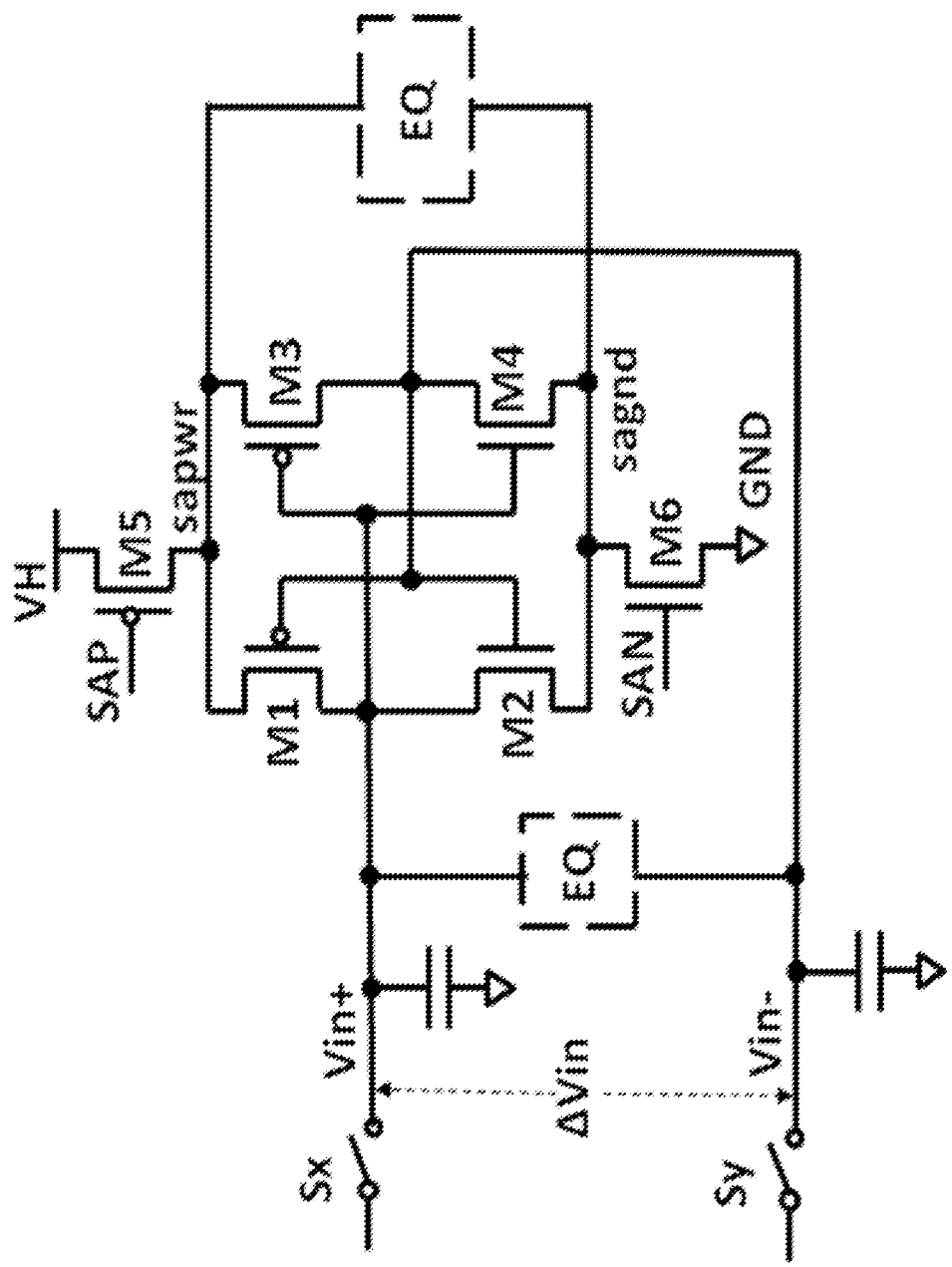
FIG. 1 is a schematic diagram of the structure of an existing sensitivity amplifier.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments To those skilled in the art. The drawings are only schematic illustrations of the present disclosure and are not necessarily drawn to scale. The same reference numerals in the figures denote the same or similar parts, and thus their repeated description will be omitted.

Furthermore, the described features, structures or characteristics can be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known structures, methods, devices, implementations, or operations are not shown or described in detail to avoid overwhelming attention and obscure all aspects of the present disclosure.

In addition, the terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features.

The specific implementations of the sensitivity amplifier and its control method as well as the memory device provided by the present invention will be described in detail below with reference to the accompanying drawings.

Please refer to FIG. 2 for a schematic structural diagram of a sensitivity amplifier according to some embodiment of the present invention.

In this embodiment, the sensitivity amplifier includes a functional unit 110. The functional unit 110 includes two NMOS transistors and two PMOS transistors, and two input/output terminals. The two input/output terminals are respectively named the first input/output terminal Q1 and the second input/output terminal Q2. The two NMOS transistors are respectively named a first NMOS transistor M2 and a second NMOS transistor M4, and the two PMOS transistors are named a first PMOS transistor M1 and a second PMOS transistor M3, respectively.

The drain of the first PMOS transistor M1 is connected to the drain of the first NMOS transistor M2, and is also connected to the second input/output terminal Q2; the drain of the second PMOS transistor M3 is connected to the drain of the second NMOS transistor M4, and is further connected to the first input/output terminal Q1.

The source of the first PMOS transistor M1 is connected to the source of the second PMOS transistor M3, to serve as a high-voltage terminal sapwr; the source of the first NMOS transistor M2 is connected to the source of the second NMOS transistor M4, to serve as the low-voltage side sagnd.

The sensitivity amplifier further includes: a first driving unit 120 and a second driving unit 130. In this embodiment, the first driving unit 120 includes a first pull-up transistor M5, the drain of the first pull-up transistor M5 is connected to the high voltage terminal sapwr, and the source is connected to the power supply VH; the driving unit 130 includes a first pull-down transistor M6, the drain of the first pull-down transistor M6 is connected to the low voltage terminal sagnd, and the source is grounded. In this embodiment, the first pull-up transistor M5 is a PMOS transistor, and the first pull-down transistor M6 is an NMOS transistor. The pull-down of the first pull-down transistor M6 and the pull-up of the first pull-up transistor M5 control the voltages of the low-voltage terminal sagnd and the high-voltage terminal sapw.

The gate of the first pull-up transistor M5 is connected to the enable control signal SAP, and the gate of the first pull-down transistor M6 is connected to the enable control signal SAN. The enable control signals SAP and SAN control the on and off of the first pull-up transistor M5 and the first pull-down transistor M6. When the first pull-up transistor M5 or the first pull-down transistor M6 is both turned on, the sensitivity amplifier enters the working state. In this specific embodiment, the first pull-up transistor M5 and the first pull-down transistor M6 are of different types, and the enable control signal SAP and the enable control signal SAN are inverted to each other.

The functional unit 110 also includes four switch units. One switch unit is connected between the first PMOS transistor and the first input/output terminal Q1, and between the first NMOS transistor and the first input/output terminal Q1. One switch unit is also connected between the second PMOS transistor and the second input/output terminal Q2 and between the second NMOS transistor the second input/output terminal Q2. The switches configure the first PMOS transistor, the second PMOS transistor, the first NMOS transistor, and the second NMOS transistor into the amplifier mode or the diode mode. In the diode mode, the gates and drains of the MOS transistors are connected; in the amplifier mode, the gates and drains of the MOS transistors are disconnected, and the gates are connected to the corresponding input/output terminals.

In this specific embodiment, the first PMOS transistor M1 is connected to the first switch unit 141, the first NMOS transistor M2 is connected to the second switch unit 142, and the second PMOS transistor M3 is connected to the third switch unit 143. The second NMOS transistor M4 is connected to the fourth switch unit 144.

Each of the switch unit includes a first switch and a second switch, the first switch is connected between the gate and the drain of each of the first PMOS transistor, the second PMOS transistor, the first NMOS transistor, and the second NMOS transistor. The second switch is connected between the gate of each of the first PMOS transistor, the second PMOS transistor, the first NMOS transistor, and the second NMOS transistor and the corresponding input/output terminals. Specifically, the first switch unit 141 includes a switch S4 and a switch S6, wherein the switch S4 is connected between the gate and the drain of the first PMOS transistor M1, and the switch S6 is connected between to the gate of the first PMOS transistor M1 and the first input/output terminal Q1; the second switch unit 142 includes a switch S0 and a switch S2, wherein the switch S0 is connected between the gate and the drain of the first NMOS transistor M2, and the switch S2 is connected between the gate of the first NMOS transistor M2 and the first input/output terminal Q1; the third switch unit 143 includes a switch S5 and a switch S7, wherein the switch S5 is connected between the gate and the drain of the second PMOS transistor M3, the switch S7 is connected between the gate of the second PMOS transistor M3 and the second input/output terminal Q2; the fourth switch unit 144 includes a switch S1 and a switch S3, wherein the switch S1 is connected between the gate and drain of the second NMOS transistor M4, the switch S3 is connected between the gate of the second NMOS transistor M4 and the second input/output terminal Q2.

The switches S0~S7 each can be a single switching element, such as a MOS transistor, a diode or a thyristor, etc., or a circuit unit with switching characteristics formed by connecting one or more switching elements and other circuit elements, such as a transmission gate circuit composed of multiple switching elements.

The gate of the first NMOS transistor M2 is used to connect to the bit line BL, corresponding to the voltage signal Vin+, and the gate of the second NMOS transistor M4 is used to connect to the reference bit line Ref_BL, corresponding to the voltage signal Vin−. There will be parasitic capacitance between the ground and the signal input end of the bit line BL or the reference bit line Ref_BL. Parasitic capacitance is unavoidable in any real process, but the influence of parasitic capacitance can be mitigated or minimized by circuit design and process improvements.

In this specific implementation manner, a first pre-charging module EQ1 is connected between the first input-output terminal Q1 and second input-output terminal Q2, which is used to perform the EQ (pre-charge) phase of the sensitivity amplifier. The first input/output terminal Q1 and the second input/output terminal Q2 are both charged to a preset voltage value. Preferably, the preset voltage value is half of the power supply voltage, that is, ½ VH. In other embodiments, the preset voltage value can also be set to other values, either higher or lower than ½ VH, based on circuit requirements.

A second pre-charging module EQ2 is also connected between the high-voltage terminal sapwr and low-voltage terminal sagnd, which is used to charge both the high-voltage terminal sapwr and the low-voltage terminal sagnd to the preset voltage value during the EQ (pre-charge) stage of the sensitivity amplifier.

The first pre-charging module EQ1 and the second pre-charging module EQ2 may have the same circuit structure, and the first pre-charging module EQ1 and the second pre-charging module EQ2 may each include three MOS transistors with their gates connected with each other(please refer to FIG. 2b), where the source of one transistor is connected to the drain of the other transistor, and a preset voltage is input to the connection terminal. In this specific embodiment, the preset voltage is VH/2, and the on and off states of the three MOS transistors are controlled by the control voltage EQ. When the control voltage EQ makes all the three MOS transistors on, the upper and lower two notes are charged to VH/2. In other specific embodiments, a person skilled in the art can reasonably set the structure and preset voltage value of the first pre-charging module EQ1 and the second pre-charging module EQ2 according to actual needs.

Figure 2A:
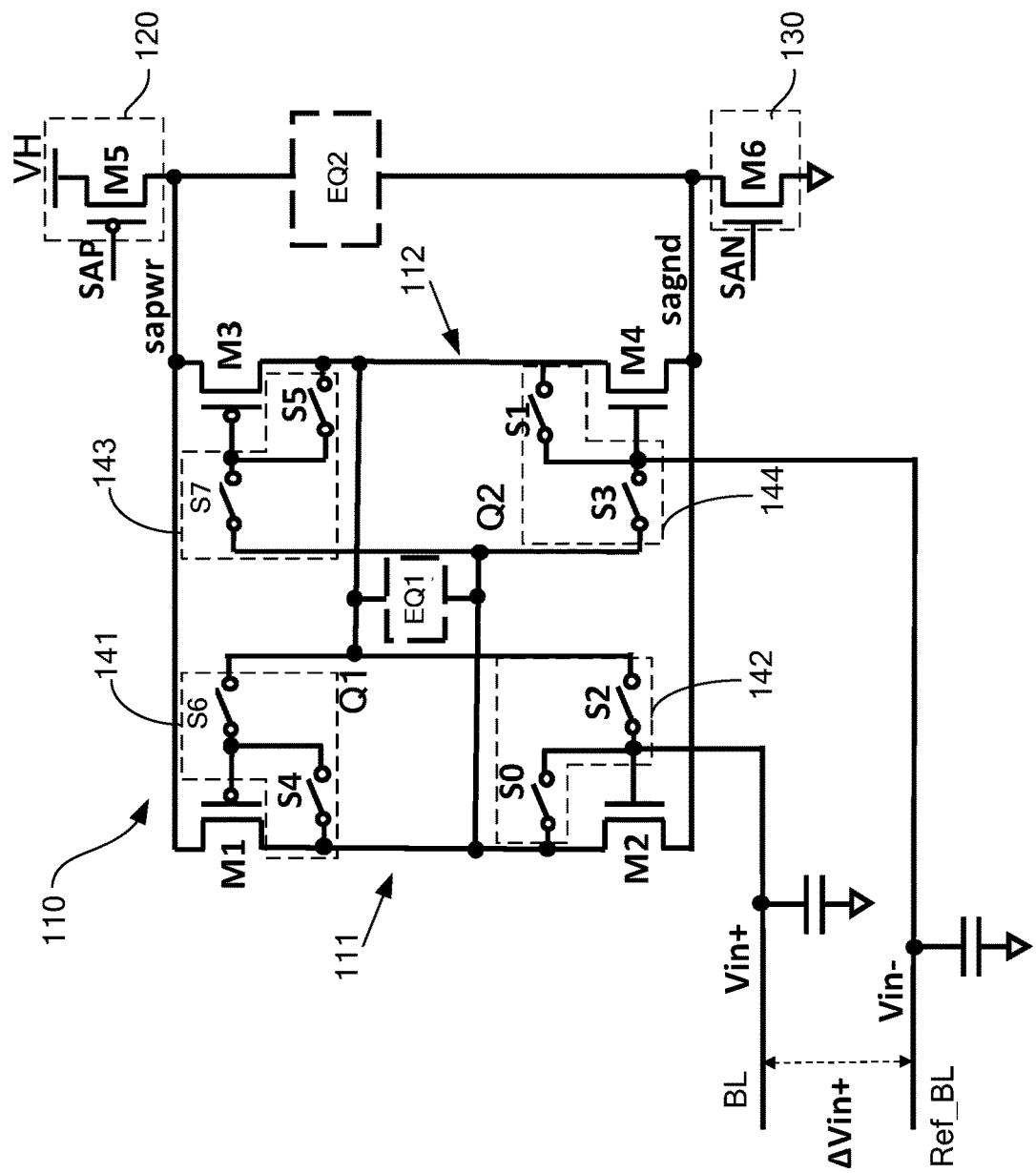
FIG. 2a and FIG. 2b are schematic structural diagrams of a sensitivity amplifier according to some embodiments of the present invention.
Figure 2B:
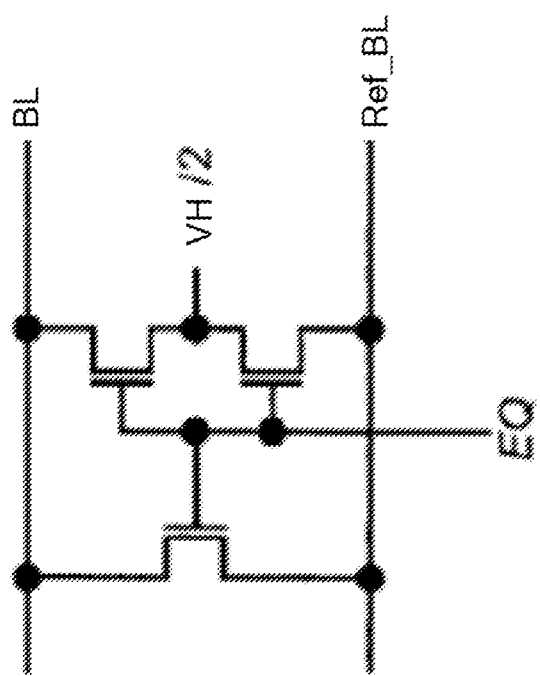

The embodiment of the present invention also provides a control method of the sensitivity amplifier as shown in FIG. 2a.

The work flow of the sensitivity amplifier includes: a pre-charge stage, a mismatch elimination stage, a small signal input stage, and a signal amplification stage.

Figure 3:
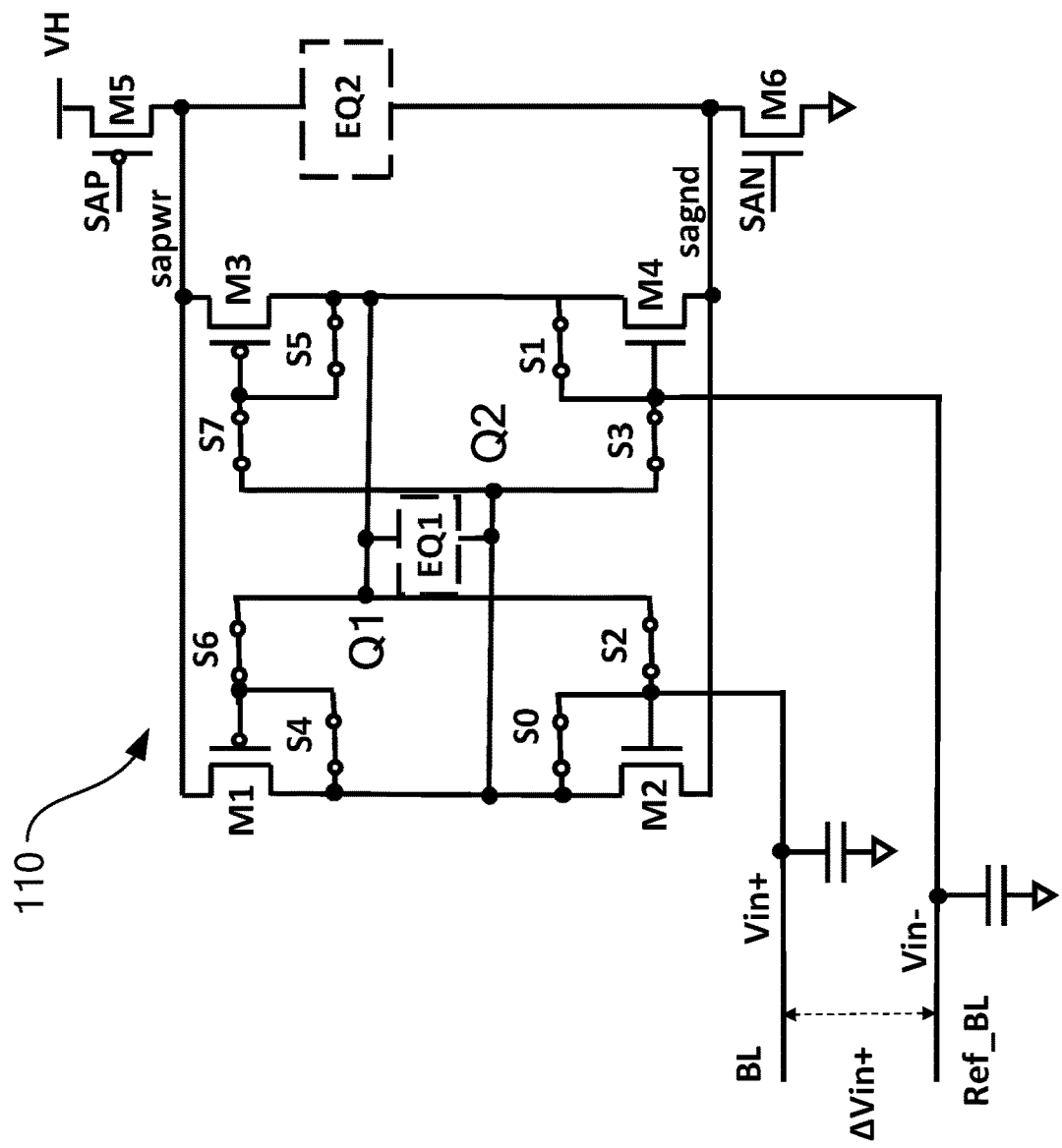
FIG. 3 is a schematic structural diagram of a sensitivity amplifier according to another embodiment of the present invention.

Please refer to FIG. 3 as in the pre-charge stage, the first PMOS transistor M1, the second PMOS transistor M3, the first NMOS transistor M2, and the second NMOS transistor M4 are all connected in a diode mode. The gates of the first PMOS transistor M1 and the first NMOS transistor M2 are connected to the first input/output terminal Q1, and the gates of the second PMOS transistor M2 and the second NMOS transistor M4 are connected to the second input/output terminal Q2.

In this specific embodiment, the switches S0 to S7 are controlled to be turned on, so that the threshold of each node of the sensitivity amplifier is at the correct initial value, and the first pre-charge module EQ1 pre-charges the first input/output terminal Q1 and the second input/output terminal Q2, so as to pre-charge both the Vin+ and Vin− to preset voltage valued, preferably at ½ VH. The high-voltage terminal sapwr and low-voltage terminal sagnd are also pre-charged to ½ VH.

After the pre-charging is complete, the system enters the mismatch elimination phase. By adjusting the connections among the first PMOS transistor M1, the second PMOS transistor M3, the first NMOS transistor M2 and the second NMOS transistor M4, the mismatched voltage difference between the gates of the first NMOS transistor M2 and the second NMOS transistor M4 is compensated.

Figure 4:
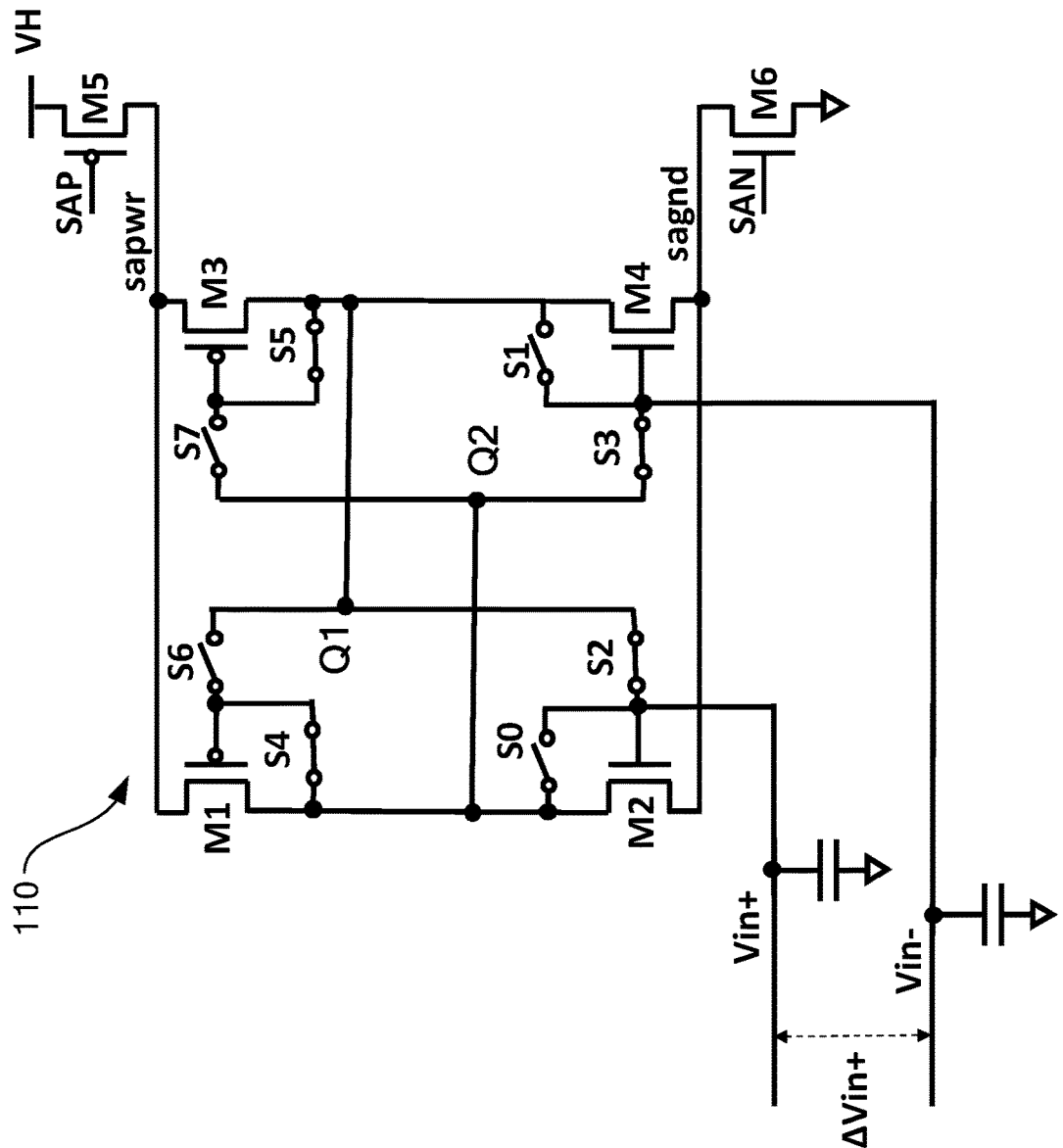
FIG. 4 is a schematic structural diagram of a sensitivity amplifier according to another embodiment of the present invention.

FIG. 4 is a schematic diagram of a circuit at a mismatch elimination stage in one embodiment of the present invention.

In the mismatch elimination stage, neither the first pre-charging module EQ1 nor the second pre-charging module EQ2 works, that is, the MOS transistors in the pre-charging module are all in the disconnected state, so they are omitted in FIG. 4.

In this embodiment, the mismatch elimination stage includes a first mismatch elimination stage, applying the first mismatch elimination method, which includes: connecting both the first PMOS transistor M1 and the second PMOS transistor M3 in a diode mode, connecting both the first NMOS transistor M2 and the second NMOS transistor M4 in an amplifier mode, and amplifying the mismatched voltage by the gain, forming an overdrive to accelerate setting up a voltage difference for compensation, then store it in a parasitic capacitance of the bit line and the reference bit line.

Specifically, the switches S6 and S7 are turned off, and the switches S4 and S5 are turned on, so that both the first PMOS transistor M1 and the second PMOS transistor M3 are connected in a diode mode; the switches S0 and S1 are turned off, and the switches S2 and S3 are turned on, so the first NMOS transistor M2 and the second NMOS transistor M4 are connected to be in the amplifier mode.

Figure 5:
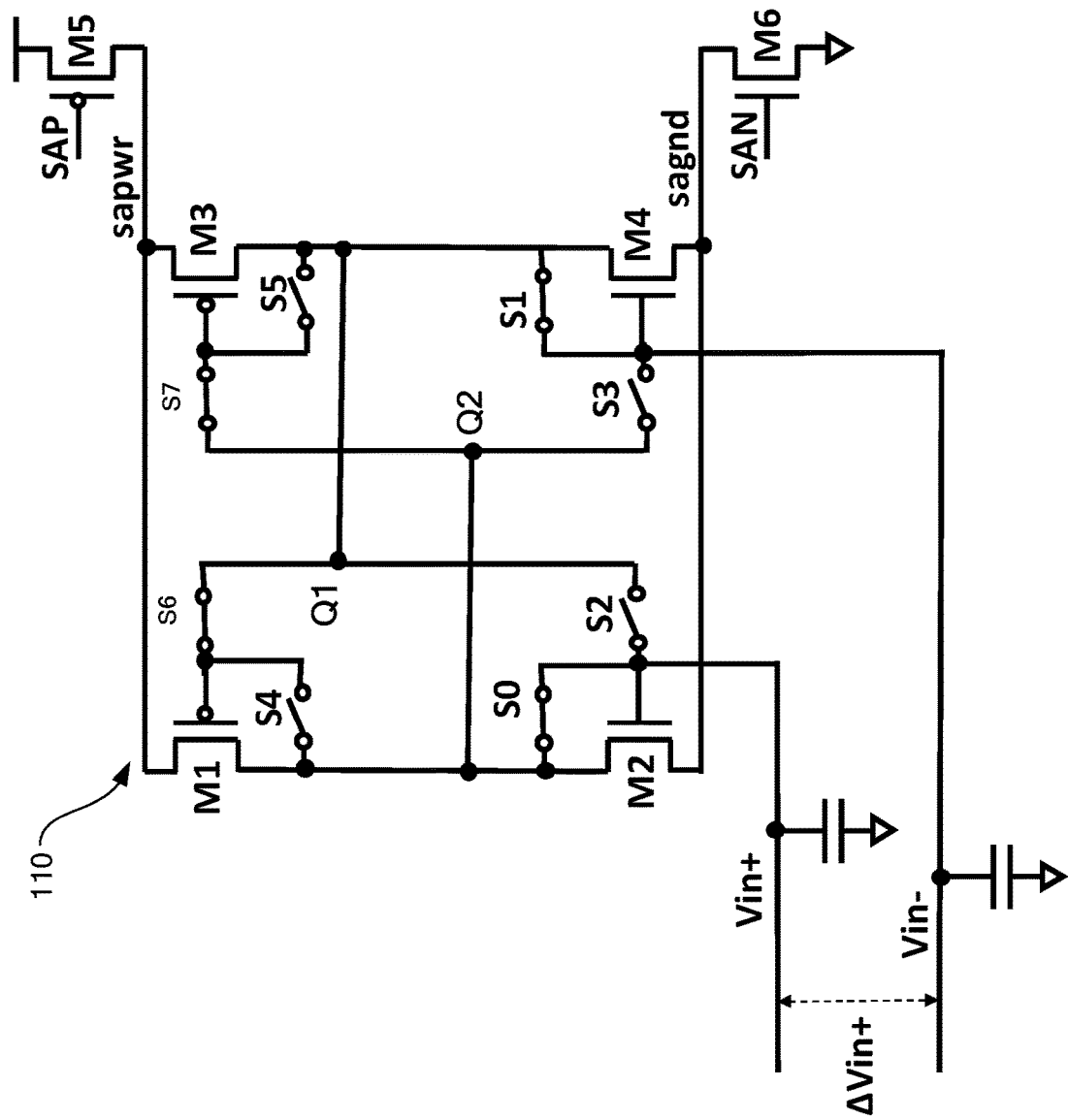
FIG. 5 is a schematic structural diagram of a sensitivity amplifier according to another embodiment of the present invention.

FIG. 5 is a schematic diagram of a circuit of the mismatch elimination stage according to another embodiment of the present invention.

In this embodiment, the mismatch elimination stage includes a first mismatch elimination stage, applying the first mismatch elimination method, which includes: connecting both the first PMOS transistor M1 and the second PMOS transistor M3 into an amplifier mode, and connecting both the first NMOS transistor M2 and the second NMOS transistor M4 in a diode mode, and the mismatched voltage is also amplified by gain to form an overdrive to accelerate setting up a voltage difference for compensation, then store it on the parasitic capacitance of the bit line and the reference bit line.

Specifically, the switches S6 and S7 are turned on, and the switches S4 and S5 are turned off, so that the first PMOS transistor M1 and the second PMOS transistor M3 are both connected in the amplifier mode; the switches S0 and S1 are turned on, and the switches S2 and S3 are turned off, so that the first NMOS transistor M2 and the second NMOS transistor M4 are connected in the diode mode.

Figure 6:
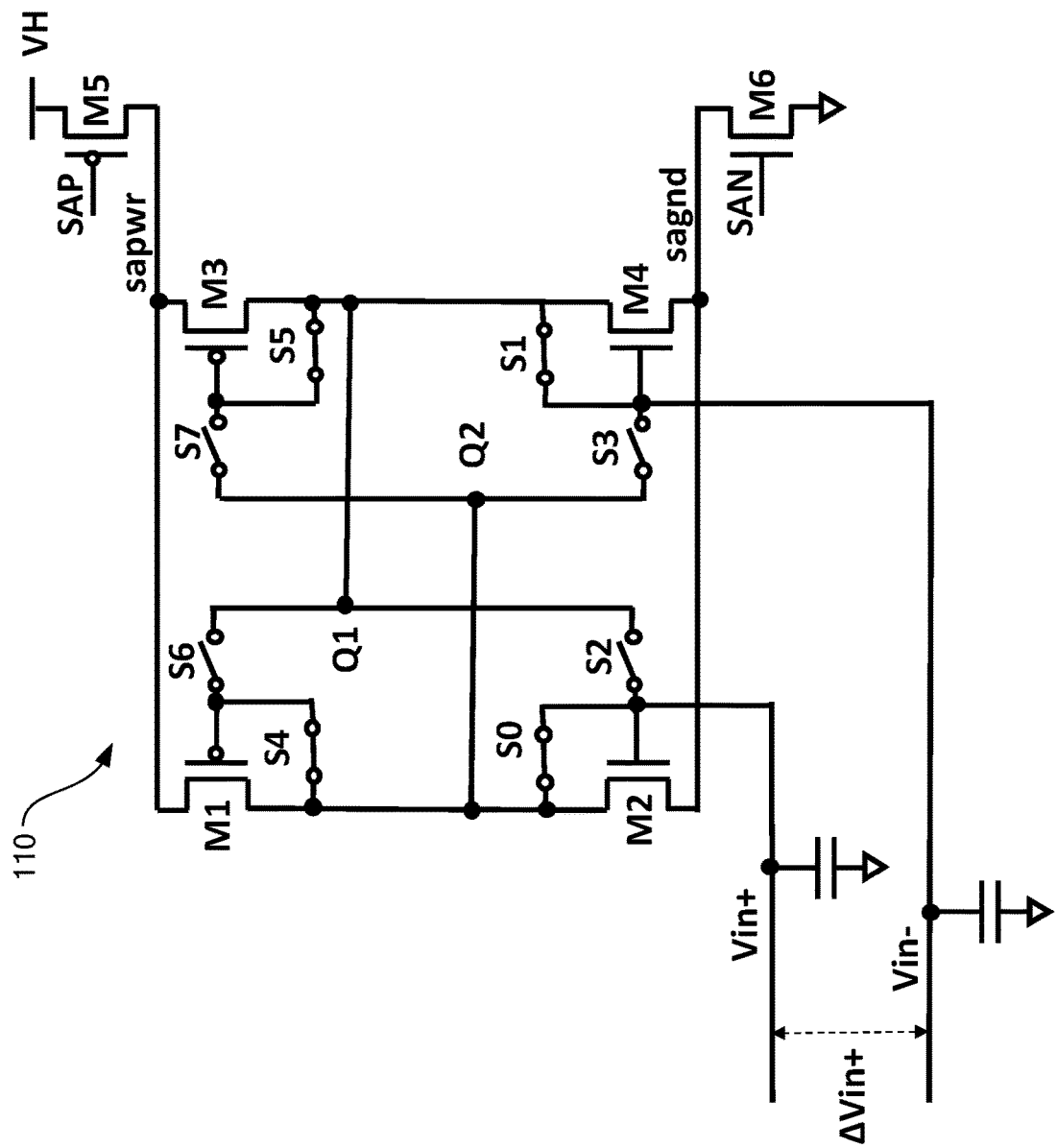
FIG. 6 is a schematic structural diagram of a sensitivity amplifier according to another embodiment of the present invention.

FIG. 6 is a schematic diagram of a circuit of the mismatch elimination stage in another embodiment of the present invention.

In this specific embodiment, the mismatch elimination stage includes a second mismatch elimination stage. Applying the second mismatch elimination method includes: connecting the first PMOS transistor M1, the second PMOS transistor M3, the first NMOS transistor M2 and the second NMOS transistor M4 all into the diode mode to adjust the compensation voltage.

Specifically, the switches S2, S3, and the switches S6 and S7 are turned off, and the switches S0, S1, S4, and S5 are turned on, so as to connect all the transistors M1 to M4 in a diode mode.

Figure 7:
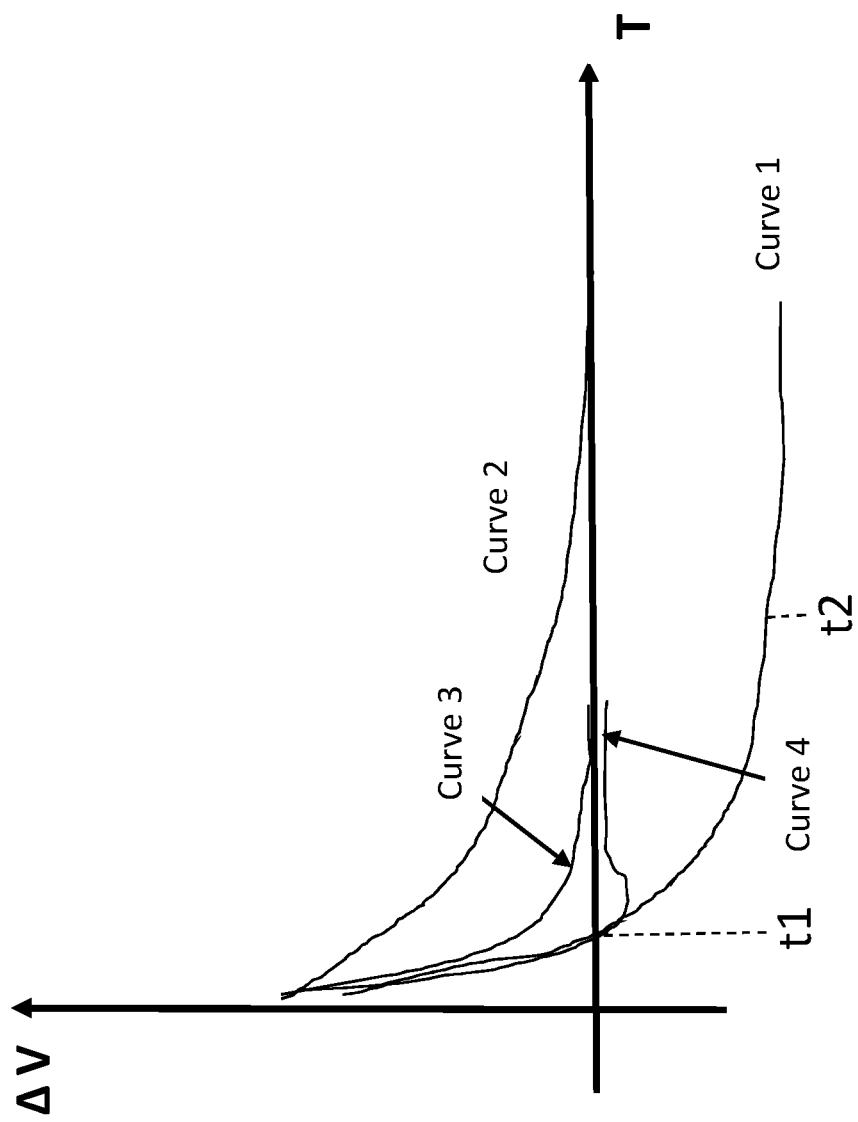
FIG. 7 is a schematic diagram of the change of the mismatch voltage in the mismatch elimination stage of an embodiment of the present invention.

In the mismatch elimination process of the above-mentioned embodiments, the first mismatch elimination method has the advantage of being extremely fast, but the disadvantage is that the time is not easy to control. Over compensation will occur as time goes by. For example, the first NMOS transistor M2 and the second NMOS transistor M4 have the mismatch voltage of 50 mV, as shown in FIG. 7's Curve 1, using the first mismatch elimination method, the compensation voltage adjustment reached 50 mV at t1, and it is possible it has been compensated at t2, so that the initial difference between Vin+ and Vin− has reached 100 mV, this result is not desired. Moreover, considering the influence of the transistor's process, power supply, and temperature changes, etc., the optimal time point is more difficult to control.

As for the second mismatch elimination method, shown in Curve 2, when time goes by, there is a final stable and expected ideal compensation, but the disadvantage is that it takes a longer time.

Therefore, in another embodiment, the first mismatch elimination method and the second mismatch elimination method may be combined, and the mismatch elimination stage is divided into a first mismatch elimination stage and a second mismatch elimination stage. In order to avoid over-compensation, the second mismatch elimination stage can be carried out after the first mismatch elimination stage. The combination of the two can achieve a faster compensation speed without the problem of over-compensation. Process, power supply and temperature are less dependent on during time control. Please refer to the Curves 3 and 4 in FIG. 7, after combining the first mismatch elimination method with the second mismatch elimination method, the mismatch voltage can be stabilized at near zero. Curve 3 shows that the first mismatch elimination stage has a shorter time. When the mismatch voltage has not reached zero, it enters the second mismatch elimination stage, and finally stabilizes the mismatch voltage above and close to zero. Curve 4 shows the first mismatch elimination phase take a longer time and overcompensation has occurred. After entering the second mismatch elimination phase, the mismatch voltage is pulled back and stabilizes to near zero.

A person skilled in the art can reasonably select the mismatch elimination method in the mismatch elimination stage according to the requirements for compensation time or compensation accuracy, and may use either one of the first mismatch elimination method and the second mismatch elimination method separately, or a combination of both.

After the mismatch cancellation phase is completed, the method enters the small signal input phase and subsequent signal amplification mode.

In the small signal input stage, the first input terminal and the first output terminal Q1 of the sensitivity amplifier senses the small signal change on the bit line BL, inputs it to the functional unit 110 for amplification, and enters the signal amplification stage.

Figure 8:
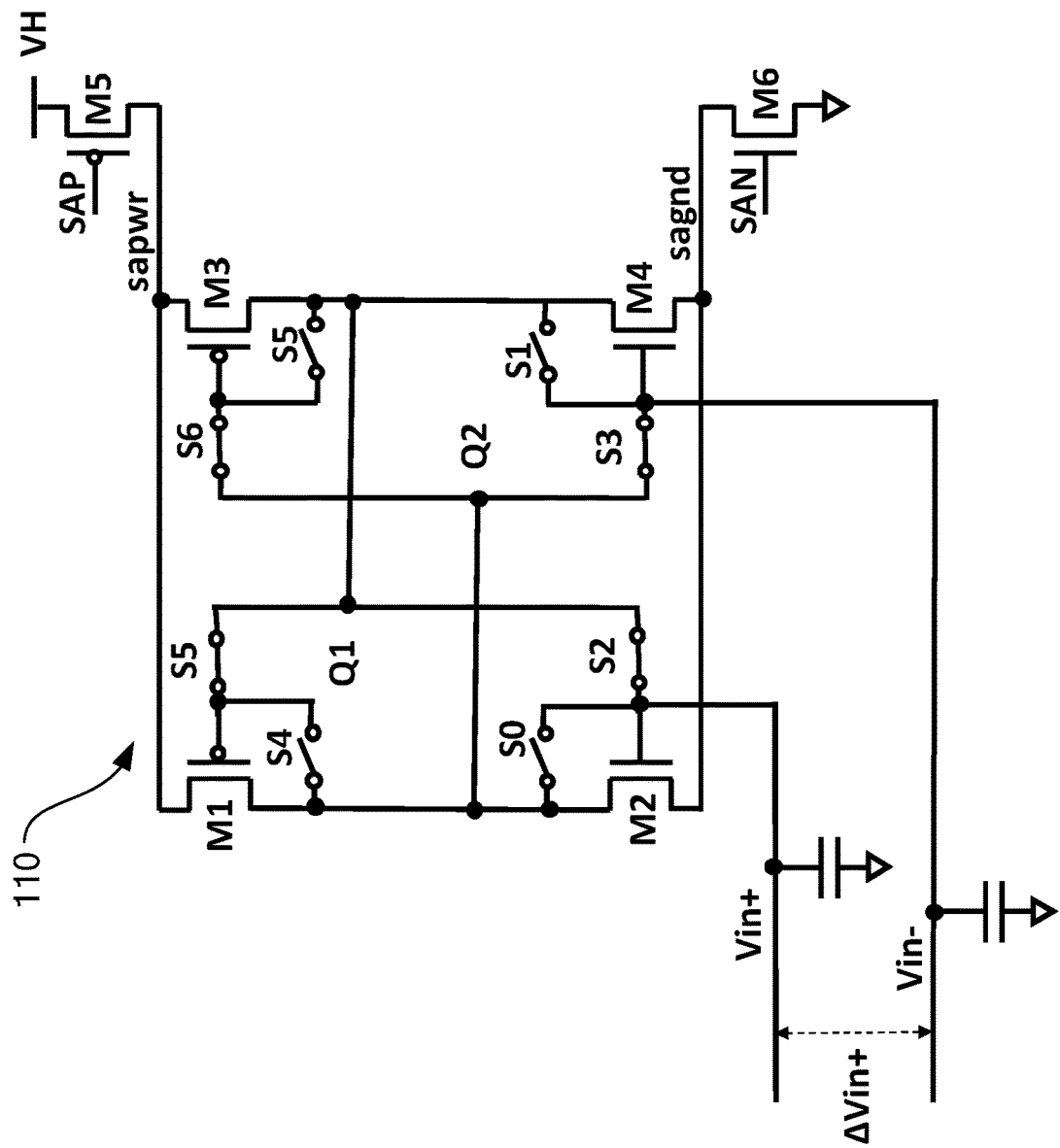
FIG. 8 is a schematic structural diagram of a sensitivity amplifier according to an embodiment of the present invention.

FIG. 8 is a schematic diagram of a sensitivity amplifier circuit in a signal amplification stage according to one embodiment of the present invention.

In the signal amplification stage, the first PMOS transistor M1, the second PMOS transistor M3, the first NMOS transistor M2, and the second NMOS transistor M4 are all connected in the amplifier mode, so that the first PMOS transistor M1, the second PMOS transistor M3, the first NMOS transistor M2 and the second NMOS transistor M4 constitute a latch circuit.

Specifically, the switches S2, S3, S5, and S6 are all turned on, and the switches S0, S1, S4, and S5 are all turned off.

In the above-mentioned sensitivity amplifier and its control method, one switch unit is connected to each of the four MOS transistors of the functional unit 110 of the sensitivity amplifier. By adjusting the connections of the MOS transistors through the switch units, the mismatch elimination stage can be added, thereby the offset voltage can be compensated.

In the mismatch elimination stage, it is necessary to stabilize the high-voltage and low-voltage terminal voltages, as well as the voltages of internal nodes, so that they always stay equal to or stabilized near the pre-charged voltage.

Figure 9:
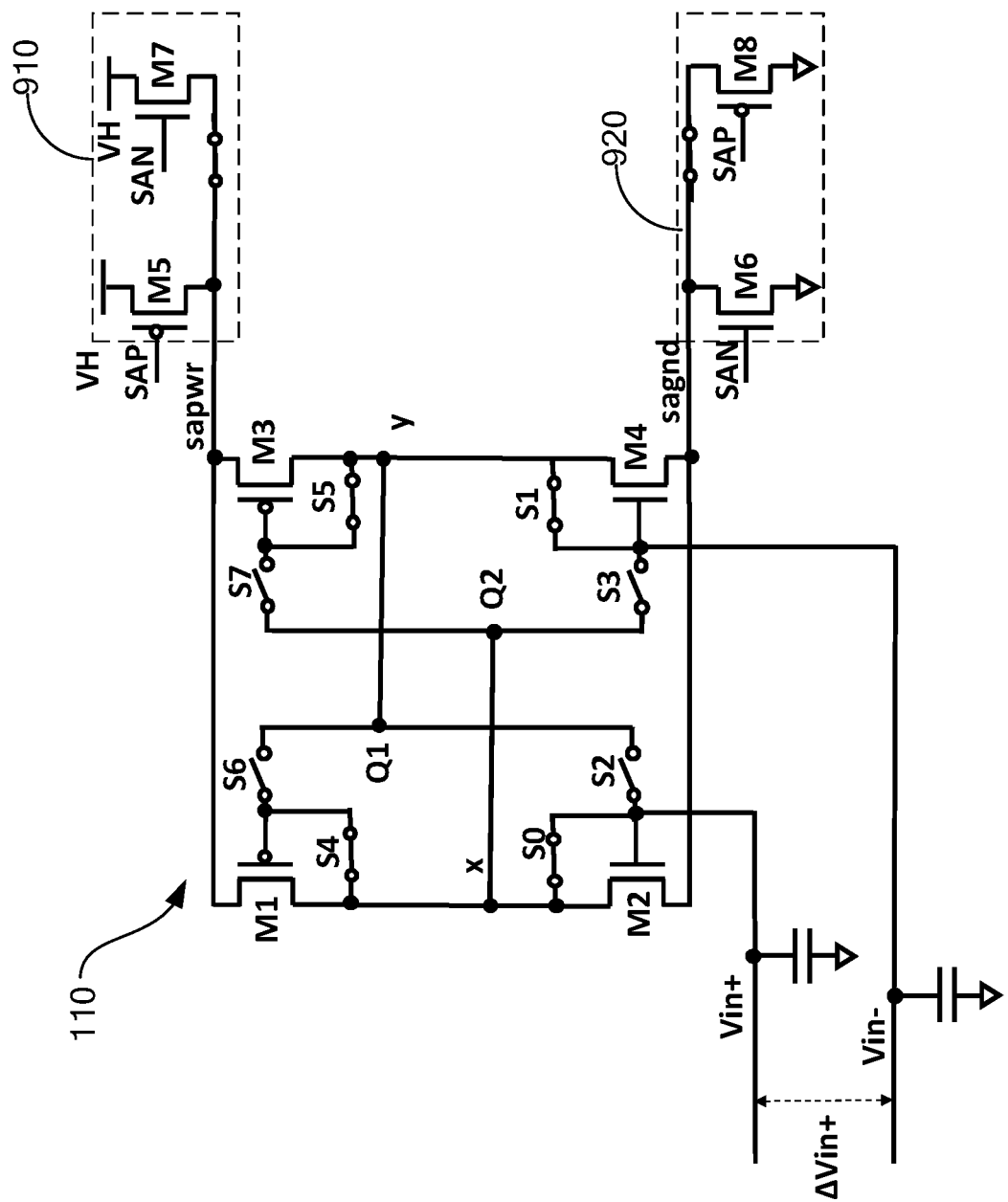
FIG. 9 is a schematic structural diagram of a sensitivity amplifier according to an embodiment of the present invention.

FIG. 9 is a schematic diagram of a sense amplifier circuit structure according to one embodiment of the present invention.

In this embodiment, the first drive unit 910 of the sensitivity amplifier includes a first pull-up transistor M5 and a second pull-up transistor M7, and the second drive unit 920 of the sensitivity amplifier includes a first pull-down transistor M6 and a second pull-down transistor M8.

The drain terminal of the first pull-up transistor M5 is connected to the high voltage terminal sapwr, and the source of the first pull-up transistor M5 is connected to the power supply VH; the source of the second pull-up transistor M7 is connected to the high voltage terminal sapwr, and the drain of the second pull-up transistor M7 is connected to the power supply VH.

The drain of the first pull-down transistor M6 is connected to the low voltage terminal sagnd, and the source is connected to the ground terminal; the source of the second pull-down transistor M8 is connected to the low voltage terminal sagnd, and the drain of the second pull-down transistor M8 is connected to the ground terminal.

In this embodiment, the type of the second pull-up transistor M7 is different from the type of the first pull-up transistor M5, and the type of the first pull-down transistor M6 is different from the type of the second pull-down transistor M8. The gate of the first pull-up transistor M5 is connected to the enable control signal SAP, the gate of the second pull-up transistor M7 is connected to the enable control signal SAN, and the gate of the first pull-down transistor M6 is connected to the enable control signal SAN, the gate of the second pull-down transistor M8 is connected to the enable control signal SAP.

Specifically, the second pull-up transistor M7 is an NMOS transistor, the first pull-up transistor M5 is a PMOS transistor, the first pull-down transistor M6 is an NMOS transistor, and the second pull-down transistor M8 is a PMOS transistor. In this way, the order of the transistors from the power supply VH to the ground is NMOS, PMOS, NMOS, PMOS, and it is easy to keep the nodes x, y, Q1, Q2 and Vin+ and Vin− within the latch circuit 110 stable at about ½ VH.

In the embodiment of the present invention, a memory device is also provided, and the memory device includes the sensitivity amplifying circuit as described in the above embodiments.

For a memory device with multiple memory units, the same bit line is connected to multiple memory units. The sensitivity amplifier circuit may include multiple functional units (please refer to functional unit 110 in FIG. 2a) to form an array, and the high voltage end the low voltage end of each functional unit are respectively connected to the first driving unit and the second driving unit. Each functional unit corresponding to a column of memory units is connected to a bit line and an associated reference bit line.

Figure 10:
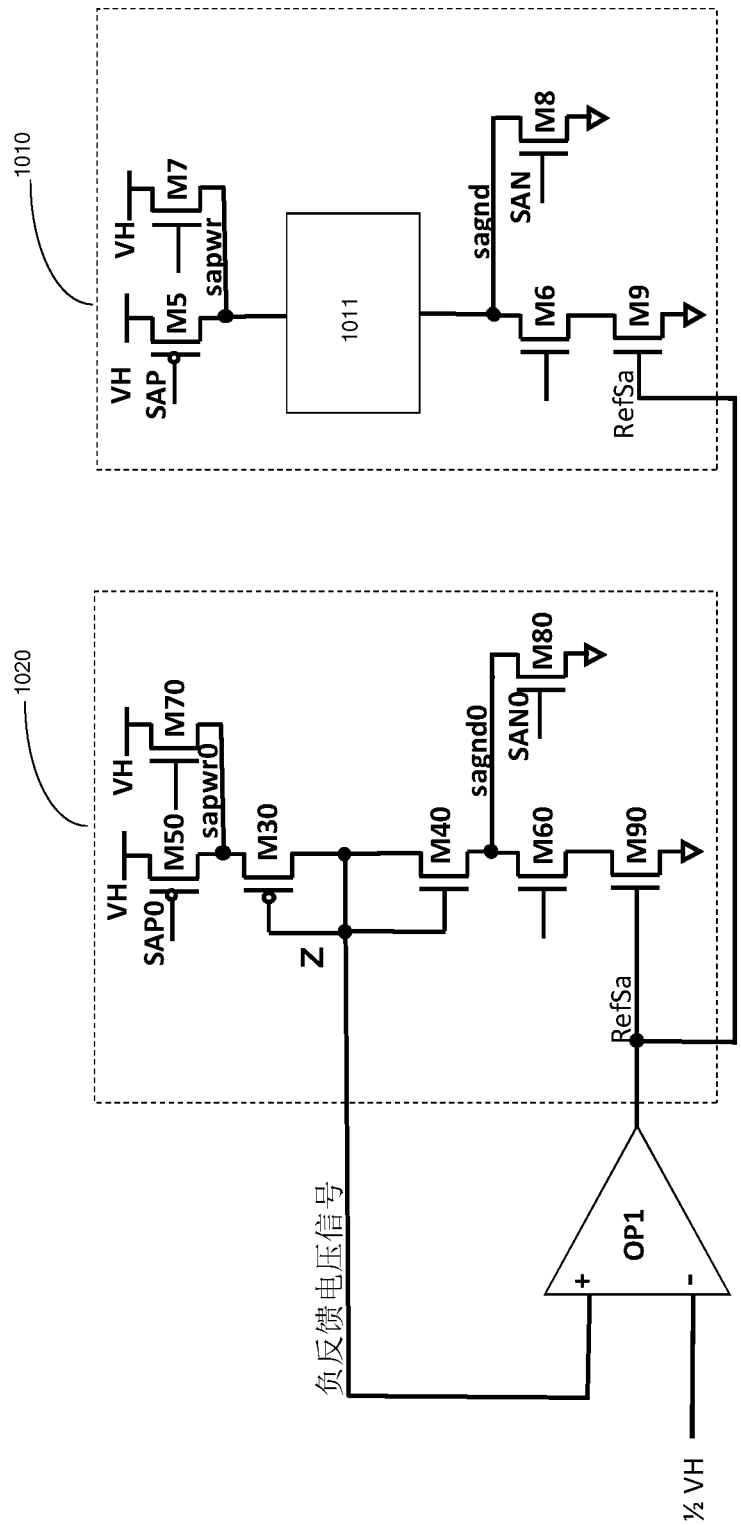
FIG. 10 is a schematic structural diagram of a sensitivity amplifier according to an embodiment of the present invention.

FIG. 10 is a schematic structural diagram of a read-write circuit of a memory device according to one embodiment of the present invention.

The memory read-write circuit includes a sensitivity amplifier 1010 for small signal amplification and a negative feedback adjustment module arranged on the periphery of the memory device. The negative feedback adjustment module includes a cloning circuit 1020 and an operational amplifier OP1. The cloning circuit 1020 clones the first driving unit, the second driving unit and at least one set of inverters inside the sensitivity amplifier 1010.

Specifically, the cloning circuit 1020 includes a transistor M50 corresponding to the first pull-up transistor M5 in the sense amplifier 1010, and a transistor M70 corresponding to the second pull-up transistor M7; and further includes a transistor M60 corresponding to the first pull-down transistor M6, and transistor M80 corresponding to the second pull-down transistor M8.

The second driving unit of the sensitivity amplifier 1010 further includes a feedback transistor M9 for receiving the feedback signal output by the feedback adjustment module. The source of the feedback transistor M9 is grounded, and the drain of the feedback transistor M9 is connected to the source of the first pull-down transistor M6. The feedback transistor M9 may be an NMOS transistor.

The clone circuit 1020 also includes a transistor M90 corresponding to the feedback transistor M9, the source of the transistor M90 is grounded, and the drain of the feedback transistor M90 is connected to the source of the transistor M60.

The "correspondence" between the above-mentioned transistors refers to the same connection relationship with other devices in the circuit, the same transistor type, the same aspect ratio, the same electrical parameters, and the same the layout and the matching wiring. In order to reduce the circuit area, while maintaining the same aspect ratio, the size of each transistor in the clone circuit 1020 can be reduced proportionally.

The functional unit array 1011 in the sensitivity amplifier 1010 may include one functional unit (please refer to the functional unit 110 in FIG. 2a) or an array composed of multiple functional units.

Since the cloning circuit 1020 is mainly used to monitor the circuit characteristics of each functional unit in the functional unit array 1011, and the functional unit includes two symmetrical inverters in the amplification mode, in order to reduce the circuit size and cost, the cloning circuit 1020 can clone only one NMOS transistor and one PMOS transistor in the functional unit, and specifically include a PMOS transistor M30 and an NMOS transistor M40.

The drain of the PMOS transistor M30 is connected to the drain of the NMOS transistor M40 as an output terminal; the gate of the PMOS transistor M30 is connected to the gate of the NMOS transistor M40 as an input terminal, and the input terminal and the output terminal connection, so that the PMOS transistor M30 and the NMOS transistor M40 both adopt a diode connection. The connection node between the gate of the PMOS transistor M30 and the gate of the NMOS transistor M40 serves as an intermediate point Z. The intermediate point Z is used to output a negative feedback voltage signal and is connected to the positive input terminal of the operational amplifier OP1. The level of potential of the intermediate point Z can reflect the of the PMOS transistor M30 current capability and the NMOS transistor M40 current capability.

The output terminal of the operational amplifier OP1 is connected to the gate of the feedback transistor M9 in the second driving unit, or to the gate of the feedback transistor M90 corresponding to the feedback transistor M9 in the cloning circuit 1020. The feedback control signal RefSa is output to the feedback transistor M9 and the feedback transistor M90.

The negative input terminal of the operational amplifier is connected to the reference voltage terminal. Through the feedback adjustment module, the negative feedback voltage signal can be stabilized near the reference voltage. Since the cloning circuit 1020 clones the circuit of the sensitivity amplifier 1010, the voltage value of the middle point Z is approximately the same as the voltage value of the input/output terminals of the functional unit in the sensitivity amplifier 1010, so that the nodes x, y, Q1, Q2 and Vin+ and Vin− inside the functional unit in the sensitivity amplifier 1010 (see FIG. 9) are stable around the reference voltage.

In this embodiment, the reference voltage is a preset voltage value to which the sensitivity amplifier pre-charges the first input/output terminal Q1 and the second input/output terminal Q2 during the pre-charge stage. In this embodiment, the reference voltage is ½ VH, so that the voltage of each node in the sensitivity amplifier 1010 is stabilized at ½ VH.

For example, when the negative feedback voltage signal output by the middle point Z of the inverter in the clone circuit 1020 is greater than ½ VH, the voltage of the feedback control signal RefSa output by the operational amplifier increases, which enhances the feedback transistors M90 and M9 to turn on, and increased the current flowing through the transistor M60, so that the source voltage of the transistor M60 is pulled down, and the voltage Vgs between the gate and source of the M60 increases, and the source potential of the transistor M40 is pulled down and the drain voltage drops. The drain voltage of the transistor M40 is the voltage at the middle point Z, thereby reducing the negative feedback voltage signal at the middle point Z.

Similarly, when the negative feedback voltage signal at the middle point Z is less than ½ VH, the feedback control signal RefSa output by the operational amplifier is at low level, which is fed back to the cloning circuit 1020, so that the negative feedback voltage signal at the middle point Z rises.

Finally, the negative feedback voltage signal at the middle point Z is stabilized at ½ VH. Since the circuit of the clone circuit 1020 corresponds to the circuit of the sensitivity amplifier 1010, the voltage at the middle point Z is the voltage of the internal node of the functional unit of the sensitivity amplifier 1010, therefore the voltage of the internal node of the functional unit is stabilized at ½ VH.

The above-mentioned memory device read-write circuit, after the adding a negative feedback adjustment module, monitors the voltage of the internal nodes of the functional unit of the functional module through the cloning circuit. During the mismatch elimination stage, the memory read-write circuit stabilizes the node voltages in the sensitivity amplifier, with the help of the feedback voltage signal from the negative feedback adjustment module.

The above are only the preferred embodiments of the present invention. It should be pointed out that for those of ordinary skill in the art, without departing from the principle of the present invention, several improvements and modifications can be made, and these improvements and modifications should also be considered within the protection scope of the present invention.

The invention claimed is:

1. A sensitivity amplifier, comprising:
two PMOS transistors, two NMOS transistors, a first input and output terminal, and a second input and output terminal, wherein the two PMOS transistors are respectively a first PMOS transistor and a second PMOS transistor, and the two NMOS transistors are respectively a first NMOS tube and second NMOS transistor;
four switch units comprising a first, a second, a third and a fourth switch units, wherein the first PMOS transistor and the first NMOS transistor are connected to the first input and output terminal respectively through the first switch unit and the second switch unit, and wherein the second PMOS transistor and the second NMOS transistor are connected to the second input and out terminal respectively through the third switch unit and the fourth switch unit, and wherein each of the four switch units configures respectively each of the two PMOS transistors and each of the two NMOS transistors into an amplifier mode or a diode mode; and
wherein a gate of the first NMOS transistor connects to a bit line, and a gate of the second NMOS transistor connects to a reference bit line.

2. The sensitivity amplifier according to claim 1, wherein the four switch units each comprises a first switch and a second switch, and wherein the first switch is connected to gate and drain of each of the two PMOS transistors and each of the two NMOS transistors; and wherein the second switch is connected to the gate of each of the two PMOS transistors and each of the two NMOS transistors and corresponding input and output terminals.

3. The sensitivity amplifier according to claim 1, wherein the drain of the first PMOS transistor is connected to the drain of the first NMOS transistor, and is slso connected to the second input and output terminal, the source of the first PMOS transistor and the source of the second PMOS transistor are connected as a high voltage terminal; wherein the drain of the second PMOS transistor is connected to the drain of the second NMOS transistor, and is connected to the first input and output terminal; and wherein the source of the first NMOS transistor and the source of the second NMOS transistor are connected as a low voltage terminal.

4. The sensitivity amplifier according to claim 3, further comprising: a first driving unit and a second driving unit; wherein the first driving unit comprises a first pull-up transistor, a drain of the first pull-up transistor is connected to the high voltage terminal, and a source of the first pull-up transistor is connected to a power supply; wherein the second driving unit comprises a first pull-down transistor, a drain of the first pull-down transistor is connected to the low voltage terminal, and the source of the first pull-down transistor is grounded.

5. The sensitivity amplifier according to claim 4, wherein the first driving unit further comprises a second pull-up transistor, a drain of the second pull-up transistor is connected to the high voltage terminal, and a source of the second pull-up transistor is connected to the power supply; wherein the second driving unit further comprises a second pull-down transistor, a drain of the second pull-down transistor is connected to the low voltage terminal, a source of the second pull-down transistor is grounded; wherein the second pull-up transistor type is different from the first pull-up transistor type, and the second pull-down transistor type is different from the first pull-down transistor type.

6. The sensitivity amplifier of claim 1, wherein a first pre-charging module is connected between the first input and output terminal and the second input and output terminal.

7. The sensitivity amplifier of claim 6, wherein a second pre-charging module is connected between the high voltage terminal and the low voltage terminal.

8. The sensitivity amplifier of claim 2, wherein each of the first switch and the second switch respectively comprises at least one of a MOS transistor, a diode, and a thyristor.

9. A memory device read-write circuit, comprising:
the sensitivity amplifier according to claim 4, wherein the second driving unit further comprises a feedback transistor, wherein a source of the feedback transistor is grounded, and a drain of the feedback transistor is connected to the source of the first pull-down transistor;
a negative feedback adjustment module, wherein the negative feedback adjustment module comprises a clone circuit and an operational amplifier, wherein the clone circuit comprises at least one NMOS transistor, one PMOS transistor, and a circuit having a same structure as the first driving unit and the second driving unit, wherein a gate of the NMOS transistor and a gate of the PMOS transistor are connected in a diode mode, and wherein the gate of the NMOS transistor and the gate of the PMOS transistor are connected to a positive input terminal of the operational amplifier; wherein an output terminal of the operational amplifier is connected to a gate of the feedback transistor in the second driving unit and further to a gate of the at least one NMOS or PMOS transistor of the clone circuit corresponding to the feedback transistor.

10. The memory device read-write circuit according to claim 9, wherein a negative input terminal of the operational amplifier is connected to a reference voltage terminal.

11. The memory device, comprising: the sensitivity amplifier according to claim 1.

12. A control method of the sensitivity amplifier according to claim 1, comprising:
  in the pre-charge stage, the first input and output terminal and the second input and output terminal are pre-charged to a preset voltage; wherein the two PMOS transistors and the two NMOS transistors are both connected in a diode mode, and wherein the gates of the first PMOS transistor and the first NMOS transistor are connected to the first input and output terminals, and the gates of the second PMOS transistor and the second NMOS transistor are connected to the second input and output terminal; and
  in the mismatch elimination stage after the pre-charging is completed, by adjusting connection modes of the two PMOS transistors and the two NMOS transistors, a mismatch voltage difference between the first input and output terminal and the second input and output terminal is compensated Distribution.

13. The control method of the sensitivity amplifier according to claim 12, wherein the mismatch elimination stage comprises a first mismatch elimination stage, and the first mismatch elimination stage comprises: connecting the first PMOS transistor and the second PMOS transistor in the diode mode, and connecting the first NMOS transistor and the second NMOS transistor in the amplifier mode; or connecting the first NMOS transistor and the second NMOS transistor in the diode mode, and connecting the first PMOS transistor and the second PMOS transistor in the amplifier mode.

14. The control method of the sensitivity amplifier according to claim 13, wherein the mismatch elimination stage comprises a second mismatch elimination stage, wherein the second mismatch elimination stage comprises connecting the PMOS transistor, the second PMOS transistor, the first NMOS transistor, and the second NMOS transistor all in the diode mode.

15. The control method of the sensitivity amplifier according to claim 14, wherein when the mismatch elimination stage further comprises both the first mismatch elimination stage and the second mismatch elimination stage, wherein the second mismatch elimination stage is placed after the first mismatch elimination stage.

16. The control method of the sensitivity amplifier according to claim 12, wherein after the mismatch elimination stage is completed, a small signal input stage and a signal amplification stage are entered.

17. The control method of a sensitivity amplifier according to claim 16, wherein in the signal amplification stage, both the two PMOS transistors and the two NMOS transistors are connected in the amplifier mode.

18. The control method of the sensitivity amplifier according to claim 17, wherein the first switch is connected between the gate and the drain of each of the two PMOS transistors and the two NMOS transistors, and wherein the second switch is connected between the gate of each of the PMOS transistor and the two NMOS transistors and the corresponding input and output terminal, wherein the first switch is turned off and the second switch is turned on during the signal amplification stage.

19. The control method of the sensitivity amplifier according to claim 18, wherein the mismatch elimination stage comprises a first mismatch elimination stage, and in the first mismatch elimination stage, turning off the second switch connecting the gates of the two PMOS transistors, turning on the first switch connecting between the gate and the drain of each of the two PMOS transistors, and turning on the second switch connecting the gates of the two NMOS transistors, turning off the first switch connecting between the gate and drain of each of the two NMOS transistors; or
  turning on the second switch connecting to the gates of the two PMOS transistors, turning off the first switch connecting between the gate and drain of each of the two PMOS transistors, turning off the second switch connecting to the gates of the two NMOS transistors, and turning on first switch connecting the gate and the drain of each of the two NMOS transistors.

20. The control method of the sensitivity amplifier according to claim 19, wherein the mismatch elimination stage further comprises a second mismatch elimination stage, wherein in the second mismatch elimination stage, each of the first switch is turned on, and each of the second switch is turned off.

* * * * *